(12) United States Patent
Gadlage et al.

(10) Patent No.: US 9,685,231 B2
(45) Date of Patent: Jun. 20, 2017

(54) IRREPRODUCIBLE AND RE-EMERGENT UNIQUE STRUCTURE OR PATTERN IDENTIFIER MANUFACTURING AND DETECTION METHOD, SYSTEM, AND APPARATUS

(71) Applicant: The United States of America as represented by the Secretary of the Navy, Washington, DC (US)

(72) Inventors: Matthew Gadlage, Bloomington, IN (US); Matthew Kay, Jasper, IN (US); James D. Ingalls, Bedford, IN (US); Adam Duncan, Bloomington, IN (US); Austin Roach, Bloomfield, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 276 days.

(21) Appl. No.: 14/246,173

(22) Filed: Apr. 7, 2014

(65) Prior Publication Data
US 2015/0144695 A1 May 28, 2015

Related U.S. Application Data

(60) Provisional application No. 61/908,394, filed on Nov. 25, 2013.

(51) Int. Cl.
*H01L 21/265* (2006.01)
*H01L 27/115* (2017.01)
(Continued)

(52) U.S. Cl.
CPC ........ *G11C 16/0408* (2013.01); *G06K 7/0013* (2013.01); *G06K 19/077* (2013.01);
(Continued)

(58) Field of Classification Search
CPC ......... H01L 29/66833; H01L 21/82345; C22C 9/06; C22C 9/08
See application file for complete search history.

(56) References Cited

U.S. PATENT DOCUMENTS

| 2005/0141281 A1* | 6/2005 | Jung ............... G11C 16/0425 365/185.23 |
| 2012/0025290 A1* | 2/2012 | Takada ............ H01L 21/28273 257/316 |
| 2015/0036437 A1* | 2/2015 | Li ....................... G11C 16/10 365/185.33 |

* cited by examiner

*Primary Examiner* — Caleb Henry
*Assistant Examiner* — Mounir Amer
(74) *Attorney, Agent, or Firm* — Christopher A. Monsey

(57) ABSTRACT

An irreproducible and re-emergent unique structure or pattern identifier manufacturing and detection method, system, and apparatus is provided. A non-volatile floating gate charge storage device can include a block of floating gate transistors that can include a semiconductor region, a source region, a drain region, a floating gate region, a tunnel oxide region, an oxide-nitrite-oxide region, and a control gate region. A structure altering stress effect is applied to the block of transistors to create a passage region in a random number of floating gate regions of floating gate transistors which changes charge storage or electrical characteristics of random elements of the block of transistors. The passage region alters charges on a floating gate region to escape in a different manner than pre-alteration form causing the floating gate region to lose its charge. An apparatus for recording and detecting such differences in pre and post alteration can also be provided.

13 Claims, 3 Drawing Sheets

(51) Int. Cl.
*G06K 19/077* (2006.01)
*G11C 16/04* (2006.01)
*H01L 29/66* (2006.01)
*G06K 7/00* (2006.01)
*H01L 29/423* (2006.01)
*H01L 29/788* (2006.01)
*H01L 27/11521* (2017.01)
*H01L 21/28* (2006.01)
*G11C 16/06* (2006.01)

(52) U.S. Cl.
CPC ........ *G11C 16/06* (2013.01); *H01L 21/28273* (2013.01); *H01L 27/11521* (2013.01); *H01L 29/42324* (2013.01); *H01L 29/66825* (2013.01); *H01L 29/66833* (2013.01); *H01L 29/7881* (2013.01)

Step 21: Providing a block of floating gate transistors, each floating gate transistor within said block of floating gate transistors can have a semiconductor substrate region; a source region and a drain region separated by said semiconductor substrate region; and a floating gate region having first and second portions, wherein said first portion can be dielectrically separated from said source region, said drain region, and said semiconductor substrate region by a tunnel oxide region, wherein said second portion can be dielectrically seperated from a control gate region by an oxide-nitrite-oxide region;

Step 23: Irradiating at least a portion of said block of floating gate transistors with heavy ion radiation to create, in a random number of said floating gate transistors within said block of floating gate transistors, passage regions in said tunnel oxide regions that permit at least a portion of an amount of charge to pass from said floating gate region, through said tunnel oxide region, and to said semiconductor substrate region when said random number of said floating gate transistors within said block of floating gate transistors are in a non-powered state.

Fig. 2

Step 31: Providing a block of floating gate transistors, each floating gate transistor within said block of floating gate transistors can have a semiconductor substrate region; a source region and a drain region separated by said semiconductor substrate region; and a floating gate region having first and second portions, wherein said first portion can be dielectrically separated from said source region, said drain region, and said semiconductor substrate region by a tunnel oxide region, wherein said second portion can be dielectrically seperated from a control gate region by an oxide-nitrite-oxide region; wherein, in a random number of said floating gate transistors within said block of floating gate transistors, said tunnel oxide regions comprises passage regions that permit at least a portion of an amount of charge to pass from said floating gate region, through said tunnel oxide region, and to said semiconductor substrate region when said random number of said floating gate transistors within said block of floating gate transistors are in a non-powered state;

Step 33: Applying an electrical bias in at least one of said semiconductor substrate regions of said block of floating gate transistors that induces a tunneling effect, said tunneling effect causing an amount of charge to gather on associated floating gate regions; wherein said amount of charge on at least one of said floating gate regions of said random number of said floating gate transistors within said block of floating gate transistors having said tunnel oxide regions with said passage regions passes from at least one of said associated floating gate regions, through at least one of said tunnel oxide regions, and to at least one of said semiconductor substrate regions when said random number of said floating gate transistors within said block of floating gate transistors are in a non-powered state.

Fig. 3

IRREPRODUCIBLE AND RE-EMERGENT UNIQUE STRUCTURE OR PATTERN IDENTIFIER MANUFACTURING AND DETECTION METHOD, SYSTEM, AND APPARATUS

CROSS-REFERENCE TO RELATED APPLICATIONS

The present application claims priority to U.S. Provisional Patent Application Ser. No. 61/908,394, filed Nov. 25, 2013, entitled "IRREPRODUCIBLE AND RE-EMERGENT UNIQUE STRUCTURE OR PATTERN IDENTIFIER MANUFACTURING AND DETECTION METHOD, SYSTEM, AND APPARATUS," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 103,033) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

The present invention generally relates to the field of random pattern creation, trusted supply chain applications, as well as pattern identifier creation and detection across a variety of structures including charge storage devices, data storage and communication systems. In particular, an embodiment can include a non-volatile floating gate charge storage device manufactured and used in accordance with exemplary method(s) of manufacturing which could include a non-volatile floating gate charge storage device.

In the fields of trusted electronics, trusted supply chain management, as well as the field of data storage and communication systems, users are concerned about security and ensuring their devices have not been tampered with. Devices that are sometimes used in this field include anti-tampering devices, unique identification devices, random number generators, cryptographic devices, etc. However, there continues to be a need for a new capability or functions associated with creation of a trusted electronics or trusted supply chain solutions such as devices with irreproducible or a physically uncloneable identification scheme or function. In other words, an aspect of an embodiment of the invention provides a function or effect to be generated that does not allow for another user, e.g., an unauthorized user, to physically clone, copy, or reproduce an original structure manufactured in accordance with an embodiment of the invention.

According to an illustrative embodiment of the present disclosure, a block of floating gate transistors can be provided and manufactured with a unique structure or pattern. A floating gate transistor within a block of floating gate transistors can comprise a semiconductor substrate region, a source region and a drain region separated by a semiconductor substrate region, and a floating gate region having first and second portions. The first portion can be dielectrically separated from the source region, the drain region, and the semiconductor substrate region by a tunnel oxide region. The second portion can be dielectrically separated from a control gate region by an oxide-nitrite-oxide region. At least a portion of the block of floating gate transistors can be subjected to a structure altering stress, e.g., irradiated with heavy ion radiation, to create passage regions in tunnel oxide regions in a random number of floating gate transistors within the block of floating gate transistors. Stress created passage regions can permit at least a portion of an amount of charge to pass from the floating gate region, through the tunnel oxide region, and to the semiconductor substrate region when a random number of floating gate transistors within the block of floating gate transistors are in a non-powered state.

Another aspect of the invention can include a detection scheme using structure that has been formed in accordance with an embodiment of the invention. For example, a first step can include providing a block or array of floating gate transistors, such as described above, that have been subjected to a stress in accordance with an embodiment of the invention that generate alterations in a random number of the floating gate transistors in the block or array subjected to the stress. Next, a detection process adapted to detect an embodiment of a structure manufactured in accordance with an embodiment of the invention can be employed that can include applying an electrical bias in at least one of the semiconductor substrate regions of the block of stressed floating gate transistors that induces a tunneling effect, the tunneling effect causing an amount of charge to gather on associated floating gate regions. Some or all of the gathered charge on the exemplary floating gate regions of the random number of floating gate transistors with the passage regions passes from at least one of the associated floating gate regions, through at least one of said tunnel oxide regions, and to at least one of the semiconductor substrate regions when the random number of the floating gate transistors within the block of floating gate transistors are in a non-powered state. In this example, the amount of charge that passes through the passage regions will vary between ones of the random number of floating gate transistors where some charge amount will range from all of the charge accumulated in the random number of floating gate regions to some of the charge in ones of the random floating gate regions. A detectable, irreproducible, and re-emerging pattern will be formed by the random number of floating gate transistors who each have a different retained charge. This pattern can be overwritten by writing to the random floating gate regions however this pattern will reemerge based on charge loss in random stress altered floating gate transistors. Other embodiments can include taking measurements at specific points in time to determine different charge states of stress altered floating gate arrays at different points of time. Stress alterations can also be done at different points of time or in different points of a supply chain to create different stress alteration patterns at different points of time or in different points in a supply chain movement.

Embodiments can also include a variant which has error correction software or circuits which can selectively deactivate stress altered charge storage devices or electrical circuits where such stress alterations alter such devices or circuits to the point where they are unusable for their intended purpose. Other embodiments can include systems which can detect unauthorized or counterfeit components by comparing component detected stress altered components and comparing them with patterns stored associated with identification codes or names of a stress altered part after biasing the devices or circuits, waiting a predetermined time, and measuring the stress altered components or devices to determine if they match the stored pattern.

Another embodiment can use this system to generate random numbers by inducing stress in an array of charge storage devices resulting in alternation of random array elements. A next step can include reading out the randomly altered array components to generate a random number. Stress sources, such as radiation sources, can generate random alterations in devices or circuits, such as charge storage devices, that cannot be reproduced given a random nature of radiation source exposure.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which:

FIG. 2 shows an exemplary method of manufacturing a non-volatile floating gate charge storage device; and FIG. 3 shows an exemplary method of using a non-volatile floating gate charge storage device.

DETAILED DESCRIPTION OF THE DRAWINGS

Figure 1:
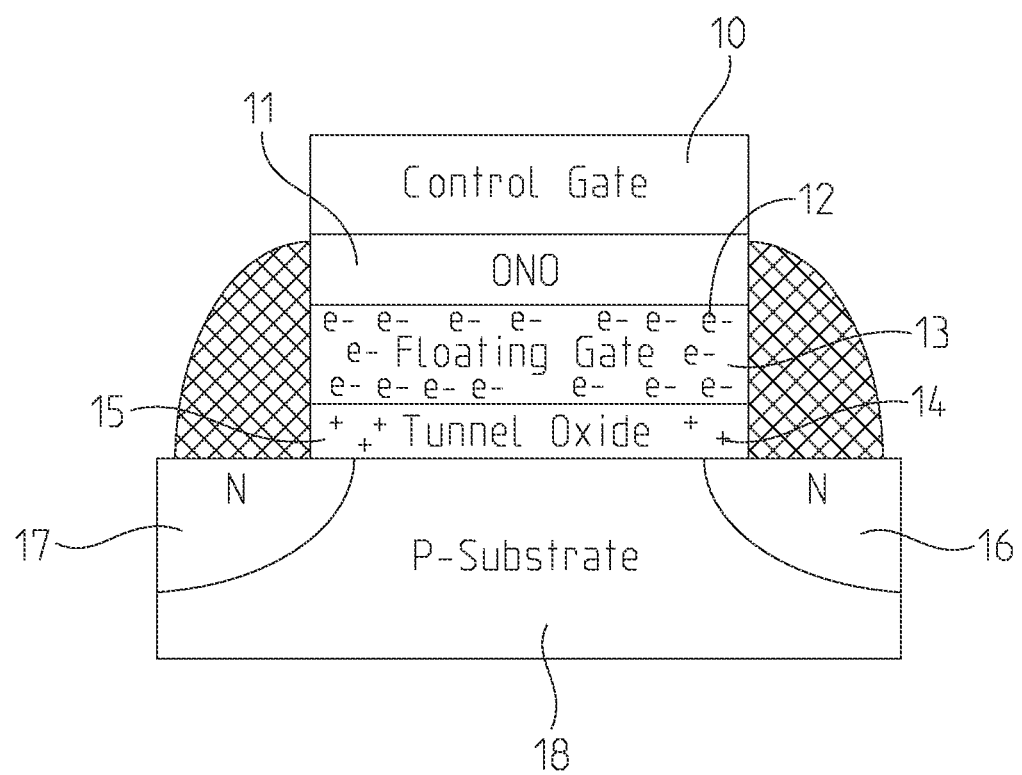
FIG. 1 shows an exemplary NPN-type floating gate transistor comprising passage regions within a tunnel oxide region.

The embodiments of the invention described herein are not intended to be exhaustive or to limit the invention to precise forms disclosed. Rather, the embodiments selected for description have been chosen to enable one skilled in the art to practice the invention.

Referring initially to FIG. 1, depicted is an exemplary n-type MOS (metal-oxide-semiconductor) floating gate transistor comprising passage regions 14 within a tunnel oxide region 15. In one embodiment, a floating gate transistor can have a semiconductor substrate region 18, a source region 17 and a drain region 16 separated by a semiconductor substrate region, and a floating gate region 13 having a first and second portions. The first portion can be dielectrically separated from the source region 17, the drain region 16, and the semiconductor substrate region 18 by a tunnel oxide region. The second portion can be dielectrically separated from a control gate region 10 by an oxide-nitride-oxide region 11.

The exemplary FIG. 1 floating gate transistor can be formed as a part of an array of electrical or charge devices which can be subjected to stress events which generate random alterations in the array of electrical or charge devices (array not shown). The array of electrical or charge devices can be biased to have an amount of charge 12, e.g., electrons in the floating gate region. The tunnel oxide region 15 of the altered electrical or charge device array can have one or more passage regions that permit an amount of charge, e.g., electrons, to pass from a floating gate region, through a tunnel oxide region, and to a semiconductor substrate region.

A variety of powered and non-powered states can be used with a variety of single structures in accordance with an embodiment of the invention as well as arrays of structures in accordance with an embodiment of the invention. For example, random stress altered floating gate transistor(s) can be in a non-powered state and the tunnel oxide region of the floating gate transistor can permit at least a portion of an amount of charge to pass from each random stress altered floating gate region, through the tunnel oxide region, and to the semiconductor substrate region. In another example, randomly stress altered floating gate transistors can be in a powered state and the tunnel oxide region of the randomly stress altered floating gate transistor can permit at least a portion of an amount of charge to pass from the floating gate region, through the tunnel oxide region, and to the semiconductor substrate region. A powered state can be a state where an amount of charge, e.g., electrons, is able to gather on a floating gate region. A non-powered state can be a state where no energy is supplied to a control gate region, a drain region, a source region, or other portion of a floating gate transistor. In another embodiment, a powered state can be when power is supplied to a block of floating gate transistors or a non-volatile floating gate charge storage device. In one embodiment, a non-powered state can be when no power is supplied to a block of floating gate transistors or a non-volatile floating gate charge storage device.

One or more passage regions can be formed in one or more tunnel oxide regions by irradiating a device, such as a floating gate transistor, a block of floating gate transistors, or a non-volatile floating gate charge storage device with a random structure altering mechanism or effect such as heavy ion radiation. By irradiating with heavy ion radiation, a random number of floating gate transistors can have passage regions in one or more tunnel oxide regions. A passage region can permit all or at least a portion of an amount of charge to pass from a floating gate region, through a tunnel oxide region, and to a semiconductor substrate region. In one example, an amount of charge can pass during a non-powered state of a floating gate transistor, a block of floating gate transistors, or a non-volatile floating gate charge storage device. In another example, an amount of charge can pass during a powered state of a floating gate transistor, a block of floating gate transistors, or a non-volatile floating gate charge storage device.

In one embodiment, a floating gate transistor can be included within a block of floating gate transistors. A block of floating gate transistors can be included within a non-volatile floating gate charge storage device. A random number of floating gate transistors within a block of floating gate transistors can have tunnel oxide regions formed by a stress inducing system or influences.

Charge storage systems, such as floating gate transistors, can be determined to either be in a "0" state or a "1" state based upon an amount of charge on associated floating gate regions. In one example, a random number of floating gate transistors within a block of floating gate transistors having tunnel oxide regions comprising passage regions is incapable of being replicated due to the random nature of a selected stress inducing influence such as a radiation source. Also, the random number of floating gate transistors have been differently altered so that they have different charge storage capacity or charge leakage rates from each other and other non-random number of floating gate transistors. When some types of radiation are used e.g. exposure to a radiation source which generates small sized random radiation emissions or energy which impact on/damage the random number of floating gate transistors, alterations or damage results which alters the impacted transistors. The size of the emissions, transistors, or a combination of both are too small to be replicated by conventional manufacturing methods and therefore are irreproducible. Also, charge storage characteristics of each of the transistors which are impacted or altered vary so that snapshots over time reveal different voltage storage capacities associated with each of the altered transistors.

Referring now to FIG. 2, depicted is an exemplary method of manufacturing a non-volatile floating gate charge storage device in accordance with an embodiment of the invention. In step 21, a block of floating gate transistors can be provided. Each floating gate transistor within the block of floating gate transistors can comprise a semiconductor substrate region, a source region and a drain region separated by a semiconductor substrate region, and a floating gate region having first and second portions. The first portion can be dielectrically separated from the source region, the drain region, and the semiconductor substrate region by a tunnel oxide region. The second portion can be dielectrically separated from a control gate region by an oxide-nitrite-oxide region.

In step 23, at least a portion of the block of floating gate transistors can be irradiated using a stress inducing means such as heavy ion radiation. Irradiating at least a portion of the block of floating gate transistors can create passage regions in tunnel oxide regions in a number of floating gate transistors within a block of floating gate transistors. In this example, after stress induced structural changes, passage regions permit an amount of charge, e.g., electrons, to pass from the floating gate region, through the tunnel oxide region, and to the semiconductor substrate region when a random number of floating gate transistors within the block of floating gate transistors are in a non-powered state. In another embodiment, passage regions permit an amount of charge, e.g., electrons, to pass from the floating gate region, through the tunnel oxide region, and to the semiconductor substrate region when a random number of stress induced structurally altered floating gate transistors within the block of floating gate transistors are in a powered state.

An electrical bias can be applied to at least one semiconductor substrate region of a block of floating gate transistors that induces a tunneling effect. A tunneling effect can cause an amount of charge to gather on associated floating gate regions. In one example, floating gate transistors within a block of floating gate transistors comprise passage regions in tunnel oxide regions which can be detected. For example, floating gate transistors comprise passage regions that can be detected in several ways including but not limited to: programming all floating gate transistors to "0" state (meaning charge is placed on respective floating gate regions), allowing time to pass while floating gate transistors are in a non-powered state, measuring which floating gates transition from "0" state to "1" state (meaning an insufficient amount of charge is on respective floating gate regions) while floating gate transistors are in a non-powered state. Another example could include measuring each individual floating gate transistor in the block or array of charge storage devices to determine if a particular floating gate transistor has passage regions within a tunnel oxide region.

In another example, which floating gate transistors in a "0" state or a "1" state, based upon said amount of charge in randomly stress altered floating gate regions, can be determined. In another example, measurements can be taken at various time intervals to determine which floating gate transistors are in a "0" state or a "1" state based upon an amount of charge on associated floating gate regions at the various time intervals. In another example, measurements can be taken at various time intervals to determine which floating gate transistors in blocks or arrays of interest are in a "0" state or a "1" state based upon an amount of charge on array transistors, including randomly stress altered floating gate regions, where comparisons can be done upon measured "0" states and "1" states of floating gate transistors from one time interval with measured "0" states and "1" states of floating gate transistors from a different time interval.

Referring to FIG. 3, an exemplary method of using a non-volatile floating gate charge storage device is shown. In step 31, for example, a block of floating gate transistors can be provided such as described in FIG. 1 or FIG. 2. Each floating gate transistor within a block of floating gate transistors can comprise a semiconductor substrate region, a source region and a drain region separated by a semiconductor substrate region, and a floating gate region having first and second portions. The first portion can be dielectrically separated from the source region, the drain region, and the semiconductor substrate region by a tunnel oxide region. The second portion can be dielectrically separated from a control gate region by an oxide-nitrite-oxide region.

One or more passage regions can be formed in one or more tunnel oxide regions in a block of floating gate transistors or a non-volatile floating gate charge storage device by stress (e.g., radiation) induced structural changes that result in random alterations to the block of floating gate arrays. In another example, one or more passage regions can be formed in one or more tunnel oxide regions in a random number of floating gate transistors within the block of floating gate transistors. The passage regions can permit at least a portion of an amount of charge to pass from a floating gate region, through a tunnel oxide region, and to a semiconductor substrate region.

In step 33, for example, an electrical bias can be applied in at least one semiconductor substrate region of a block of randomly stress altered floating gate transistors. An electrical bias can induce a tunneling effect, and a tunneling effect can cause an amount of charge to gather on floating gate regions associated with semiconductor substrate regions of a block of floating gate transistors. An amount of charge on at least one of the randomly stress altered floating gate regions of a random number of floating gate transistors within a block of floating gate transistors can pass through tunnel oxide regions, where passage regions allow at least a portion of an amount of charge to pass through tunnel oxide regions. For example, an amount of charge can pass from at least one of the randomly stress altered floating gate regions, through at least one of the tunnel oxide regions, and to at least one of the semiconductor substrate regions. Passage regions within tunnel oxide regions can allow at least a portion of an amount of charge to pass through and deplete charge on such floating gate array elements. In one example, an amount of charge can pass through in a non-powered state. In another example, an amount of charge can pass through in a powered state.

Floating gate transistors within a block of floating gate transistors comprise passage regions in tunnel oxide regions that can be detected. In another example, in a various random number of floating gate transistors within a block of floating gate transistors, at least a portion of an amount of charge passes from floating gate regions, through tunnel oxide regions, and to semiconductor substrate regions at various times.

In one embodiment, which floating gate transistors are in a "0" state or a "1" state, based upon an amount of charge on associated floating gate regions, can be determined. In another embodiment, measurements can be taken at various time intervals to determine which floating gate transistors are in a "0" state or a "1" state based upon an amount of charge on associated floating gate regions. In another embodiment, measurements can be taken at various time intervals to determine which floating gate transistors are in a "0" state or a "1" state based upon an amount of charge on associated floating gate regions and comparisons can be done upon measured "0" states and "1" states of floating gate transistors from one time interval with measured "0" states and "1" states of floating gate transistors from a different time interval.

A system can be provided which automates manufacturing of charge or electrical devices manufactured in accordance with an embodiment of the invention. For example, a work piece holder can be provided which holds an array of charge storage or electrical devices in proximity to a stress effect generator such as a radiation source. The work piece holder can be designed to provide sufficient protection from the stress generator. The system can further include a control system, monitoring system, and software running on such systems adapted to control application of stress environments, provide timing functions, and perform read/write or charge sensing functions relative to the work piece e.g., array of floating gate transistors. A data recording section can also be provided which is operated by the control system that is adapted to record electrical states of the array of charge storage or electrical devices at specific time points after application of charge. The data recording system is adapted to record work piece identification numbers and also collect charge or electrical state, as well as other characteristics of the work piece, and store such information for later use in determining if the work piece has been either altered or removed and substituted with an unauthorized or counterfeit work piece or part. A user interface can be provided which provides input and output functions as well as control functions, data storage options, as well as operational control over detection of unique patters associated with charge or electrical devices modified or manufactured in accordance with an embodiment of the invention.

Embodiments of the invention can be provided at a manufacturing phase as well as various points in a supply chain. Some embodiments can include equipment to provide a stress influence or environment or merely detect the re-emergent pattern formed by randomly stress altered charge storage or electrical structures including arrays of the same. Detection systems can be provided with communication or network capabilities to communicate with central or distributed data sources which provide access to stored patterns associated with specific items or systems that were altered using an embodiment of the invention.

Other embodiments can include error correction capabilities which can identify stress altered charge structures or electrical devices which have been sufficiently altered to the point where such altered structures or devices do not meet specifications for operation. Where error correction circuits or systems detect altered structures or devices which do not meet specifications, such error correction circuits or systems can bypass or deactivate such inoperable or non-specification structures or devices except where detection operations or processing in accordance with an embodiment of the invention are applied to such altered structures or devices.

Although the invention has been described in detail with reference to certain preferred embodiments, variations and modifications exist within the spirit and scope of the invention as described and defined in the following claims.

The invention claimed is:
1. A method of manufacturing a non-volatile floating gate charge storage device, comprising:
    providing a block of floating gate transistors, each floating gate transistor within said block of floating gate transistors comprising:
        a semiconductor substrate region;
        a source region and a drain region separated by said semiconductor substrate region; and
        a floating gate region having first and second portions, wherein said first portion being dielectrically separated from said source region, said drain region, and said semiconductor substrate region by a tunnel oxide region, wherein said second portion being dielectrically separated from a control gate region by an oxide-nitrite-oxide region; and
    irradiating at least a portion of said block of floating gate transistors with heavy ion radiation to create, in a random number of said floating gate transistors within said block of floating gate transistors, passage regions in said tunnel oxide regions that permit at least a portion of an amount of charge to pass from said floating gate region, through said tunnel oxide region, and to said semiconductor substrate region when said random number of said floating gate transistors within said block of floating gate transistors are in a non-powered state.

2. The method of manufacturing a non-volatile floating gate charge storage device of claim 1, comprising applying an electrical bias in at least one of said semiconductor substrate regions of said block of floating gate transistors that induces a tunneling effect, said tunneling effect causing said amount of charge to gather on associated floating gate regions.

3. The method of manufacturing a non-volatile floating gate charge storage device of claim 1, comprising detecting which of said floating gate transistors within said block of floating gate transistors comprise passage regions in said tunnel oxide regions.

4. The method of manufacturing a non-volatile floating gate charge storage device of claim 1, wherein, in various of said random number of said floating gate transistors within said block of floating gate transistors, said at least said portion of said amount of charge passes from said floating gate regions, through said tunnel oxide regions, and to said semiconductor substrate regions at various times.

5. The method of manufacturing a non-volatile floating gate charge storage device of claim 1, comprising determining which of said floating gate transistors are in a "0" state or a "1" state based upon said amount of charge on said associated floating gate regions.

6. The method of manufacturing a non-volatile floating gate charge storage device of claim 1, comprising measuring at various time intervals which of said floating gate transistors are in a "0" state or a "1" state based upon said amount of charge on said associated floating gate regions.

7. The method of manufacturing a non-volatile floating gate charge storage device of claim 1, comprising measuring at various time intervals which of said floating gate transistors are in a "0" state or a "1" state based upon said amount of charge on said associated floating gate regions; and comparing measured "0" states and "1" states of said floating gate transistors from one time interval with measured "0" states and "1" states of said floating gate transistors from a different time interval.

8. A method of using a non-volatile floating gate charge storage device, comprising:
    providing a block of floating gate transistors, each floating gate transistor within said block of floating gate transistors comprising:

a semiconductor substrate region;

a source region and a drain region separated by said semiconductor substrate region; and a floating gate region having first and second portions, wherein said first portion being dielectrically separated from said source region, said drain region, and said semiconductor substrate region by a tunnel oxide region, wherein said second portion being dielectrically separated from a control gate region by an oxide-nitrite-oxide region;

wherein, in a random number of said floating gate transistors within said block of floating gate transistors, said tunnel oxide region comprises passage regions that permit at least a portion of an amount of charge to pass from said floating gate region, through said tunnel oxide region, and to said semiconductor substrate region when said random number of said floating gate transistors within said block of floating gate transistors are in a non-powered state;

applying an electrical bias in at least one of said semiconductor substrate regions of said block of floating gate transistors that induces a tunneling effect, said tunneling effect causing an amount of charge to gather on associated floating gate regions;

wherein said amount of charge on at least one of said floating gate regions of said random number of said floating gate transistors within said block of floating gate transistors having said tunnel oxide regions with said passage regions passes from at least one of said associated floating gate regions, through at least one of said tunnel oxide regions, and to at least one of said semiconductor substrate regions when said random number of said floating gate transistors within said block of floating gate transistors are in a non-powered state.

9. The method of using a non-volatile floating gate charge storage device of claim 8, comprising detecting which of said floating gate transistors within said block of floating gate transistors comprise passage regions in said tunnel oxide regions.

10. The method of using a non-volatile floating gate charge storage device of claim 8, wherein, in various of said random number of said floating gate transistors within said block of floating gate transistors, said at least said portion of said amount of charge passes from said floating gate regions, through said tunnel oxide regions, and to said semiconductor substrate regions at various times.

11. The method of using a non-volatile floating gate charge storage device of claim 8, comprising determining which of said floating gate transistors are in a "0" state or a "1" state based upon said amount of charge on said associated floating gate regions.

12. The method of using a non-volatile floating gate charge storage device of claim 8, comprising measuring at various time intervals which of said floating gate transistors are in a "0" state or a "1" state based upon said amount of charge on said associated floating gate regions.

13. The method of using a non-volatile floating gate charge storage device of claim 8, comprising measuring at various time intervals which of said floating gate transistors are in a "0" state or a "1" state based upon said amount of charge on said associated floating gate regions; and comparing measured "0" states and "1" states of said floating gate transistors from one time interval with measured "0" states and "1" states of said floating gate transistors from a different time interval.

* * * * *